US009741405B2

(12) United States Patent
Suetinov et al.

(10) Patent No.: US 9,741,405 B2
(45) Date of Patent: Aug. 22, 2017

(54) DIGITAL PHASE CONTROLLED DELAY CIRCUIT

(71) Applicant: Intel Corporation, Santa Clara, CA (US)

(72) Inventors: Viacheslav Suetinov, Swindon (GB); Hans Joakim Bangs, Swindon (GB); Philip P. Hackney, Swindon (GB)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/182,495

(22) Filed: Jun. 14, 2016

(65) Prior Publication Data

US 2016/0359491 A1    Dec. 8, 2016

Related U.S. Application Data

(63) Continuation of application No. 14/577,245, filed on Dec. 19, 2014, now Pat. No. 9,369,136.

(51) Int. Cl.
| | |
|---|---|
| *G11C 8/16* | (2006.01) |
| *G11C 7/22* | (2006.01) |
| *G11C 7/10* | (2006.01) |
| *G11C 7/02* | (2006.01) |
| *H03L 7/099* | (2006.01) |

(52) U.S. Cl.
CPC ............... *G11C 7/22* (2013.01); *G11C 7/02* (2013.01); *G11C 7/1045* (2013.01); *G11C 7/1051* (2013.01); *G11C 7/1072* (2013.01); *G11C 7/1078* (2013.01); *G11C 7/222* (2013.01); *H03L 7/0996* (2013.01); *H03L 7/0998* (2013.01); *G11C 2207/2254* (2013.01)

(58) Field of Classification Search
CPC ....... G11C 7/1072; G11C 7/1078; G11C 7/22; G11C 7/1051; G11C 7/1045
USPC ..................................... 365/233.13
See application file for complete search history.

(56) References Cited

U.S. PATENT DOCUMENTS

| | | | |
|---|---|---|---|
| 7,443,761 B2 | 10/2008 | Lin | |
| 7,672,417 B2* | 3/2010 | Si | H03L 7/0814 375/354 |
| 7,719,328 B2 | 5/2010 | Fu | |
| 7,825,170 B2* | 11/2010 | Steffen | C08F 230/08 523/106 |
| 7,876,640 B2 | 1/2011 | Lin | |
| 7,990,785 B2 | 8/2011 | Song | |
| 8,289,056 B2* | 10/2012 | Xu | H03D 13/004 327/156 |
| 8,564,347 B2* | 10/2013 | Xu | H03D 13/004 327/156 |

(Continued)

OTHER PUBLICATIONS

Non-Final Office Action, mailed Oct. 7, 2015, for U.S. Appl. No. 14/577,245.

(Continued)

*Primary Examiner* — Pho M Luu
(74) *Attorney, Agent, or Firm* — Green, Howard & Mughal LLP

(57) ABSTRACT

An adjustable phase clock generator circuit is described that may include a DLL and a phase adjustor to further adjust the phase of a selected clock phase from the DLL. Both the DLL and phase adjustor may be formed from current starved delay elements that are biased from a common bias generator circuit.

23 Claims, 7 Drawing Sheets

(56) References Cited

U.S. PATENT DOCUMENTS 8,611,163 B2* 12/2013 Romanovskyy ....... G11C 7/222
 365/194
9,369,136 B1* 6/2016 Suetinov .............. G11C 7/1078

OTHER PUBLICATIONS

Notice of Allowance for U.S. Appl. No. 14/577,245 mailed Feb. 12, 2016, 8 pages.

* cited by examiner

DIGITAL PHASE CONTROLLED DELAY CIRCUIT

CLAIM FOR PRIORITY

This application is a continuation of U.S. patent application Ser. No. 14/577,245, filed on 19 Dec. 2014, titled "DIGITAL PHASE CONTROLLED DELAY CIRCUIT", which issued as U.S. Pat. No. 9,369,136 on 14 Jun. 2016, which is incorporated herein by reference in its entirety for all purposes.

FIELD OF THE INVENTION

The present invention relates generally to clock generation and propagation, and in particular, to delay locked loop circuits.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Digital DLLs (delay locked loops) are used in different applications including in memory interfaces such as DDR interfaces. Unfortunately, they can suffer from some degrading effects including non-monotonic delay trim ranges, non-uniform delay step sizes, highly supply dependent chain delays, low power efficiency (crow-bar currents), and/or high values of accumulated jitter at DLL outputs. Additionally, to overcome the non-uniform delay step size problems across PVT or to compensate for too large step sizes, DLLs may be provided with phase interpolator (PI) circuits to facilitate more accurate phase selection, which can add to area, power and jitter overhead. Moreover, while conventional PIs can compensate for delay step irregularities, they may not be able to remove phase noise resulting from supply dependencies. This supply dependency can result in high levels of output jitter in applications without very low supply ripple/noise. Accordingly, in some embodiments, a new DLL with output phase adjustment may be provided to overcome some or all of these problems.

Figure 1:
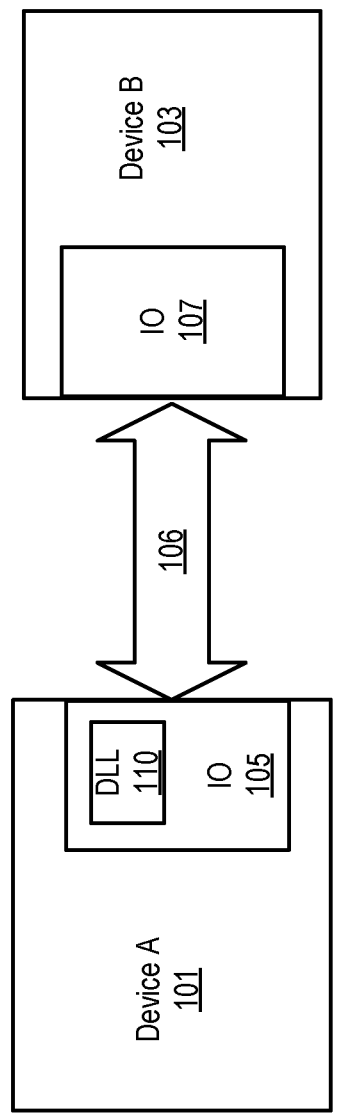
FIG. 1 is a block diagram showing first and second devices coupled together through a communications link in accordance with some embodiments.

FIG. 1 generally shows first and second devices, Device A (101) and Device B (103) coupled together through a communications link 106. Device A includes IO interface 105 including one or more DLL blocks 110. Similarly, Device B includes a corresponding IO interface 107 for communicating with Device A. In some embodiments, Device A corresponds to a computing device chip (SoC, hub, processor, etc.) and Device B corresponds to one or more memory modules with the devices connected over a DDR link (e.g., DDR3, DDR4, GDDR, or other). The DLL block(s) 110 may be used for generating clock signals with desired phase relationships to send and receive data to/from the memory over the DDR link 106. The memory (Device B) may or may not include one or more similar DLL blocks, depending on the implemented architecture.

Figure 2:
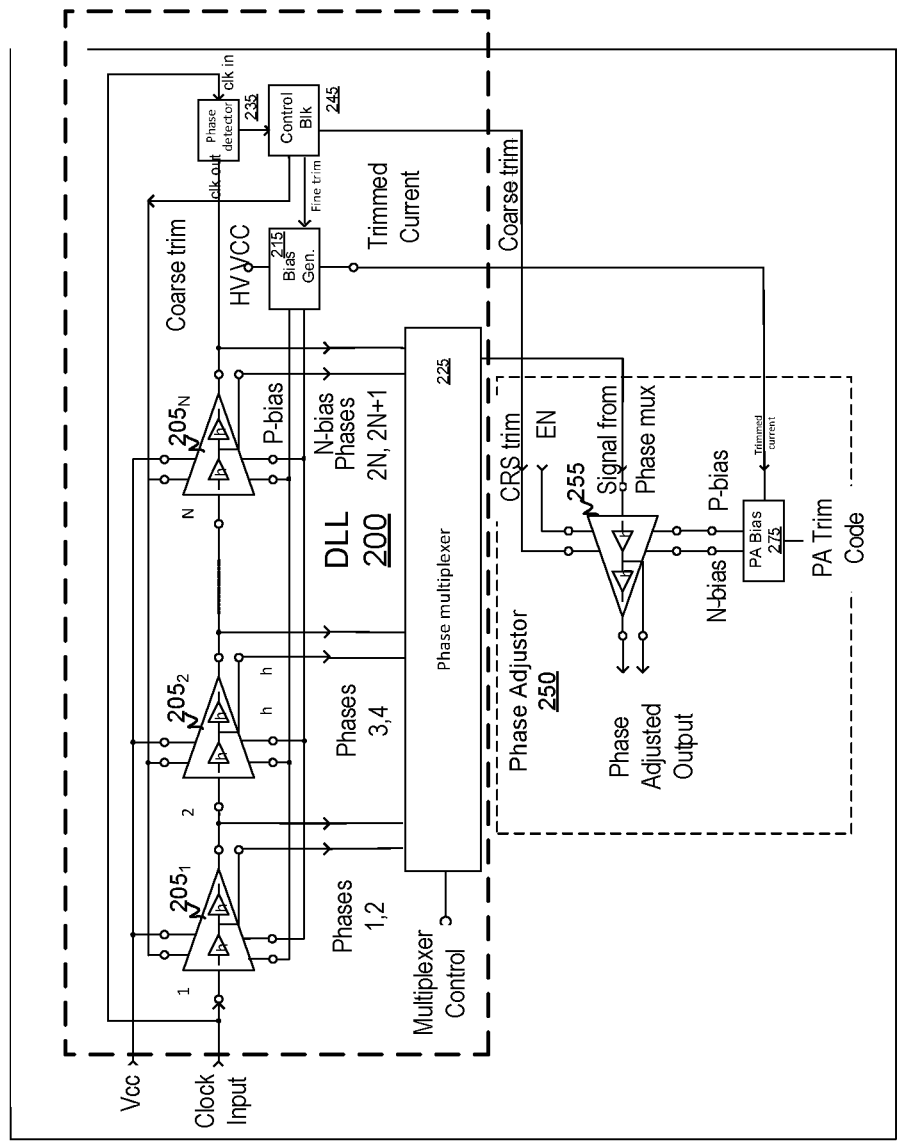
FIG. 2 is a diagram showing a DLL clock generation circuit in accordance with some embodiments.

FIG. 2 shows a phase adjustable clock generation circuit in accordance with some embodiments. In the depicted embodiment, it includes a DLL 200 to generate a selected phase signal and a phase adjustor 250 coupled to the DLL to receive the selected phase signal and to generate a more finely tuned phase adjusted signal.

Figure 3:
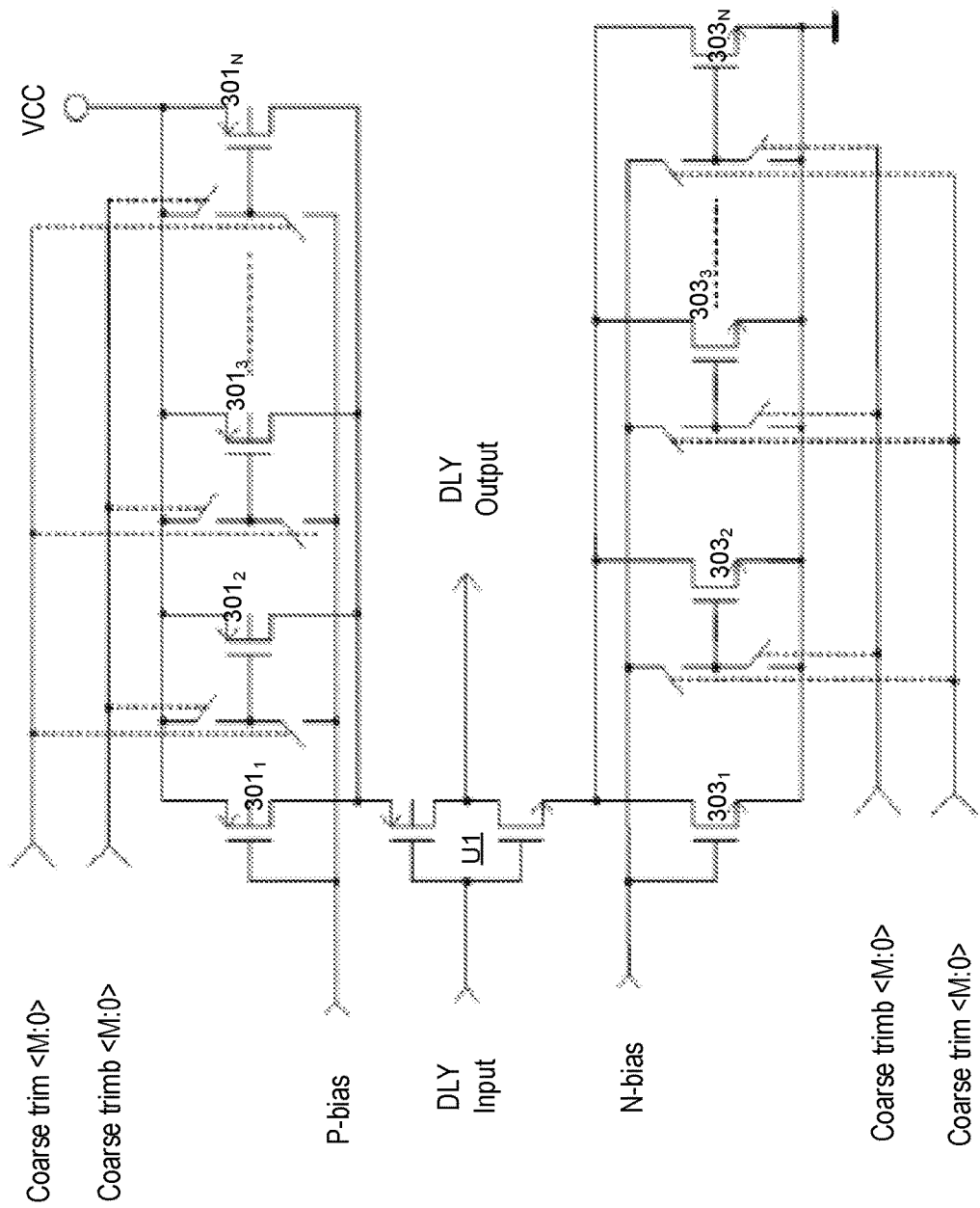
FIG. 3 is a diagram of a current starved delay element circuit in accordance with some embodiments.

The DLL is formed from a chain of delay cells $205_1$ through $205_N$, bias generator 215, phase multiplexor 225, phase comparator 235, and control block 245, coupled together as shown. Each delay cell 205 is formed from cascaded delay elements (half-delay cells "h"), an example of which is shown in FIG. 3.

An input clock is applied to an input of delay cell $205_1$. This input, along with the output from the delay cell chain (output of delay cell $205_N$), are provided to phase comparator 235, which compares the phases of the two signals and provides an error (or difference) signal to the control block 245. The control block controls the delays of the delay cells directly (course control) and indirectly through the bias generator 215 (fine control) to force this difference to 0 (or at least to sufficiently approach 0), thereby causing the input and output of the chain to be 360 degrees out-of-phase with each other. (The input corresponds to Phase 0, while the chain output (clk out) corresponds to phase 360.) The different points within the chain (1, 2, 3, 4, 2N, 2N+1) correspond to the different phase intervals that may be selected from the chain and provided from the multiplexer for selection and use.

It should be observed that the bias voltage generator is used for each of the delay cells, thus allowing for decently matched delay elements, which can result in improvements in power consumption, duty cycle stability over PVT and particularly supply noise immunity.

In the depicted embodiment, a delay cell 255, such as those used in the delay chain, may be used for the phase adjustor 250. Such a delay cell, or at least a part (e.g., delay element) of a delay cell, may be used in place of a conventional phase interpolator, especially if it can cover a desired delay range between two adjacent phases from the DLL chain. In the depicted embodiment, the delay cell 255 is biased using an associated PA bias block, which itself, is biased from the master bias generator 245, to better match its delay elements with those from the delay chain. In some embodiments, its course trimming may be controlled by the control block 245, which also controls course tuning (trimming) for the delay cells in the master delay chain.

In some embodiments, the depicted phase adjustor can generate sufficiently linear steps (e.g., about 5 pS) over extreme PVT corners and may cover a desired delay range (e.g., about 40 pS). An embodiment of the depicted phase adjustor is shown in greater detail in FIGS. 4 and 5 and described further below.

FIG. 3 is a circuit diagram showing a current starved delay element circuit in accordance with some embodiments. The delay element circuit comprises a controllably "starved" (current starved) inverter U1, along with controllably engageable (engageable/disengageable via switches), parallel source transistors ($301_1$ through $301_N$) and controllably engageable, parallel sink transistors ($303_1$ through $303_N$). In the depicted embodiment, a conventional P/N type (e.g., PMOS/NMOS) inverter is used for the delay element, P type transistors are used for the source transistors and N type transistors are used for the sink transistors.

The strength of the delay element (inverter U1 in this embodiment) is controlled in two ways. First, a course control (Course trim code) controls the number of source and sink transistors that are engaged in order to control the amount of available source/sink current for driving the inverter. Second, a fine tune (fine trim) adjustment through the bias generator (see FIGS. 2 and 4) controls a P bias (source) and N bias (sink) voltage levels for controlling the strengths of the source and sink transistors that are engaged to source/sink current to/from the delay element. In some embodiments, the course trim may be used to adjust for PVT, while the fine trim adjustment may be used by the DLL control block to control delay chain delay to lock the DLL. This delay element circuit may also be referred to in some embodiments as a "half delay" cell, as it used with reference to delay cells 205. (Along these lines, it should be appreciated that DLLs and phase adjustors, as taught herein, may be formed from delay elements arranged in any desired and/or suitable configuration without necessarily being grouped together in pairs forming delay cells. For example, an odd number of delay elements may be used to form a delay chain.)

In some embodiments, the P-type and N-type transistors for implementing the source and sink transistors are matched, among other ways, using bias signals generated by a common (e.g., master) bias generator circuit. Since the starvation transistors (source and sink transistors) are matched using the same bias source, trimming delay by trimming the bias signal can provide relatively consistent, even delay steps, independent of PVT in first order considerations.

Figure 4:
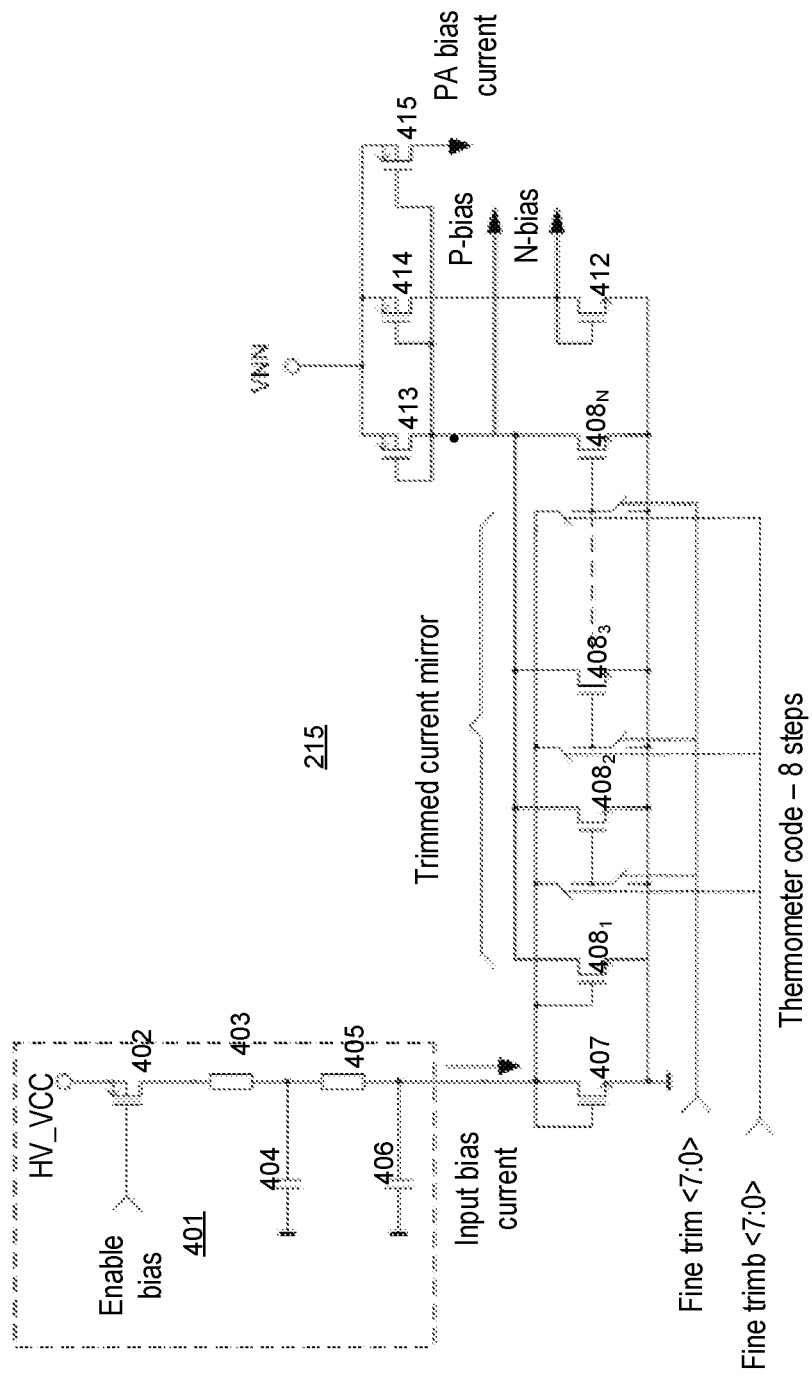
FIG. 4 is a diagram showing a bias generator circuit in accordance with some embodiments.

FIG. 4 shows a bias generator circuit 215 in accordance with some embodiments. It generally includes a current source section 401, tunable (or trimmable) input current mirror section formed from transistors $408_1$ through $408_N$, an output current mirror formed from transistors 413 through 415, and transistor 412, all coupled together as shown. The current source 401 is formed from transistors 402, 407, resistors (e.g., adjustable resistors) 403, 405, and capacitors 404, 406. A high supply (HV_VCC) relative to the lower digital supply, is used with relatively large resistors 403, 405, to generate a desired current for the input current mirror. As an example, if a 50 uA current is desired with a 2.6 high voltage supply, then each R could be about 20 K Ohm (assuming a 0.6 V drop across transistor 407). Note that in this embodiment, two resistors are used, and combined, with the two capacitors 404, 406 to form a distributed filtering chain. This, in combination with the relatively large resistor(s), can provide a fairly clean current to the input current mirror.

The input current mirrors the input current in transistor 407 by an amount corresponding to how many of the input mirror transistors ($408_1$ through $408_N$) are engaged, which is controlled by the Fine trim code. (Note that as here, when the bias circuit is used for fine delay trimming, it may be desirable to use thermometer coding as a fine code for providing monotonic delay dependence and even delay steps.) This mirrored amount determines how much current is in transistor 413, and thus, how much is in transistors 414 and 415, which mirror off of 413. Thus, it can be seen that the three bias signals: N bias voltage, P bias voltage, and PA bias current, are all drawn from commonly controlled currents from the output mirror (413, 414, and 415).

Figure 5:
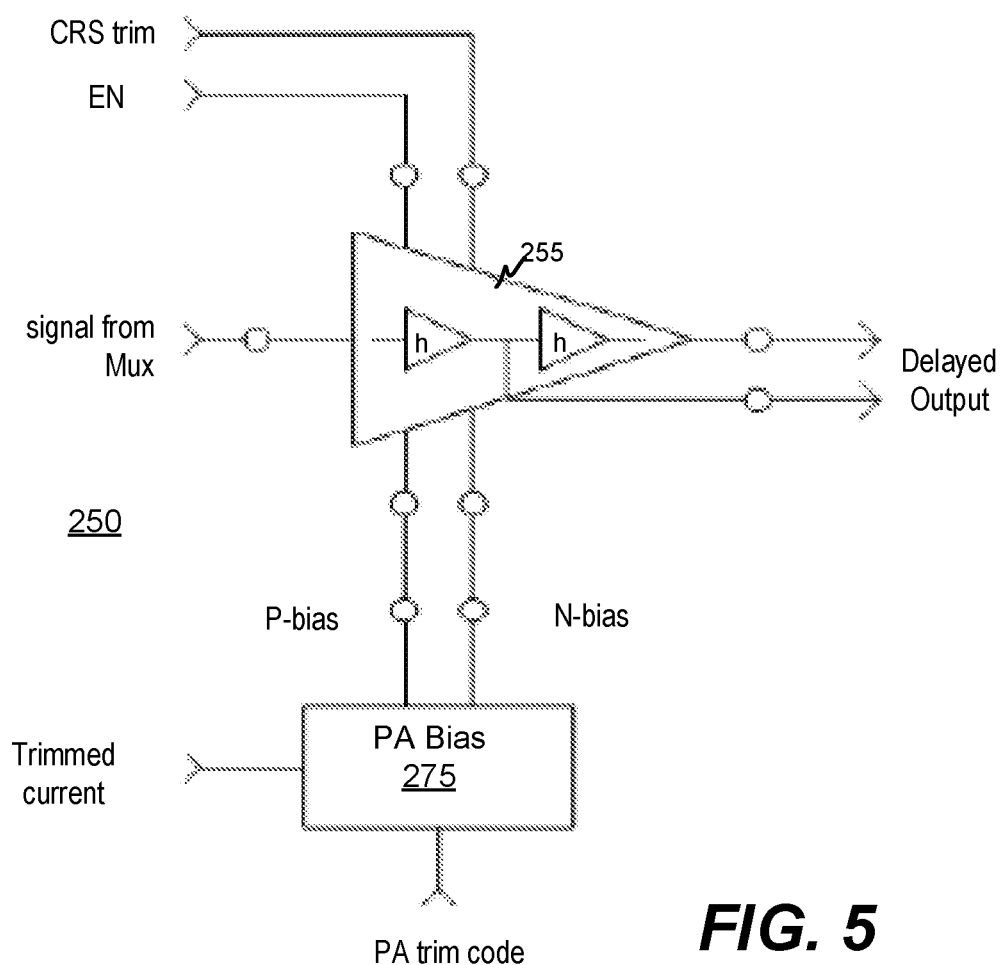
FIG. 5 is a diagram showing a phase adjustor 250 in accordance with some embodiments.

FIG. 5 is a diagram showing a phase adjustor 250 in accordance with some embodiments. It includes a full delay cell 255 (comprising first and second cascaded, starved-current delay elements "h") and a PA bias circuit 275 for providing bias signals to the delay cell 255, which is biased by current ("Trimmed current") from the master bias generator circuit 215. At its input, delay cell 255 receives the clock phase from the DLL chain (FIG. 2) selected through multiplexer 225. The additional (PA) bias block 275 (shown in more detail in FIG. 5) converts the PA trim code into corresponding delay. The PA delay step is made substantially independent of PVT corners by application of the coarse trim code to the delay cell 255, which may, and likely will, be the same as that applied to the delay cells in the DLL. Generated from the master bias generator, the received Trimmed current is derived from the current used for generating the source and sink bias voltages for the delay cells (in PA and DLL).

Figure 6:
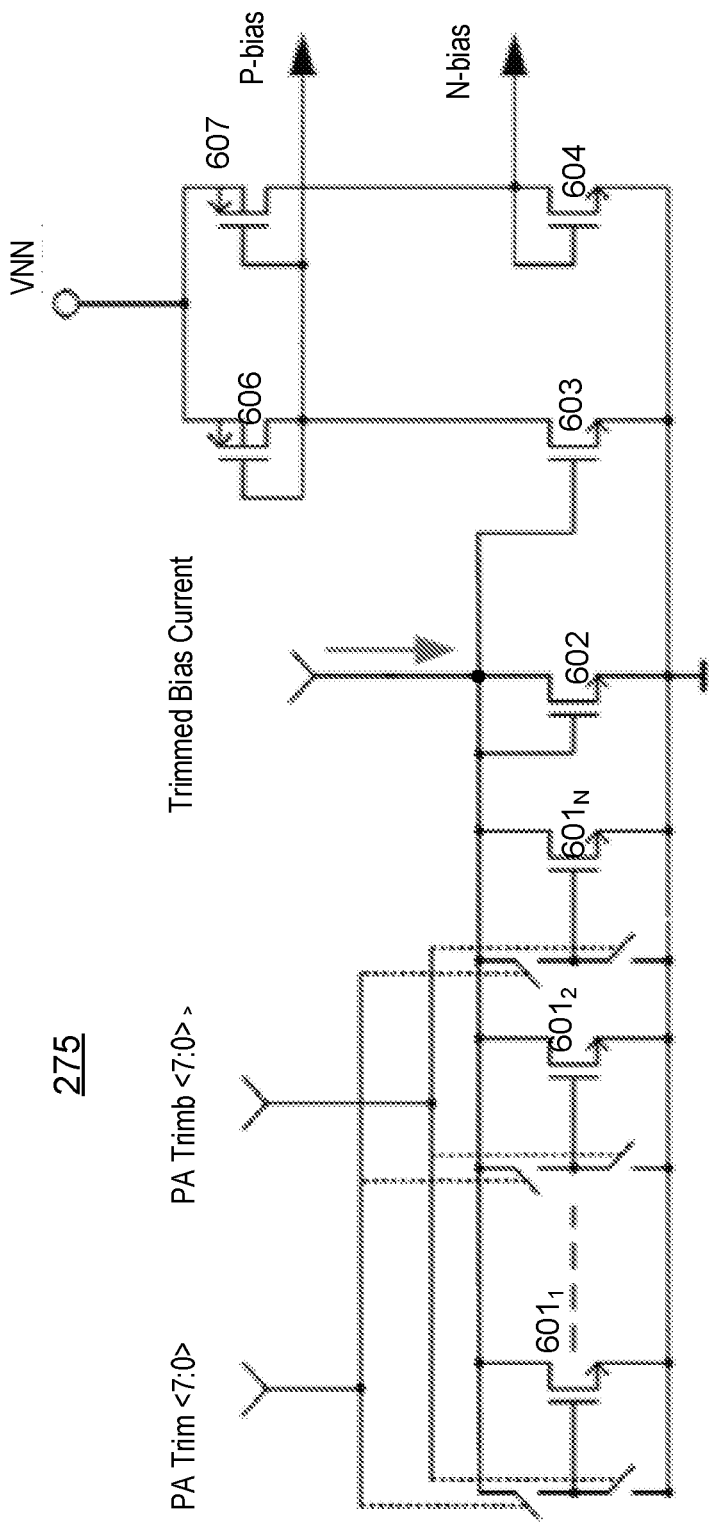
FIG. 6 shows a PA bias circuit 275 in accordance with some embodiments.

FIG. 6 shows a PA bias circuit 275 in accordance with some embodiments. It generally includes parallel, selectably engageable diode-connected transistors $601_1$ through $601_N$, diode-connected transistor 602, and transistors 603 through 607, coupled together as shown. Transistor 602 receives the trimmed bias current from the master bias generator. It is coupled in parallel to the selectably variable diode formed from transistors $601_1$ through $601_N$. The value of these parallel coupled diode connected transistors depends on the PA trim code. The bias current (injected into the 601 block and 602) is mirrored through transistors 603 and 606 (although it may be divided down depending on the size ratio of 603 to the 601/602 combination). In turn, the 606/603 current is mirrored through the series combination of 607 and 604. The P bias voltage is the voltage produced at the drain of 606, while the N bias voltage is the voltage produced at the drain of 604.

The maximum scale of the input reference diode 602 may be made slightly larger than the scale of the P-diode transistor (415) in the output current mirror of the master bias block in order to achieve marginally larger maximum delay than one in the master delay cells. Thus, when all of the input transistor diodes ($601_1$ through $601_N$ and 602) are connected in parallel, the delay is slightly larger than the interval between two adjacent clock phases. The output signal delay can be decreased by reducing the number of the input reference diodes ($601_1$ through $601_N$) until the required delay range is covered. Thus, the PA delay cell is automatically trimmed to the desired delay in the master DLL cell.

This delay can be reduced by cutting the number of the input reference diodes using the PA trim code. The trim steps are defined by thermometer code which can be chosen for achieving a desired resolution and linearity. Note that with PA delay cell 255, there is an additional output from the first half delay cell (delay element) which provides half of the delay range but with half delay step. It could be useful for precise trimming.

Figure 7:
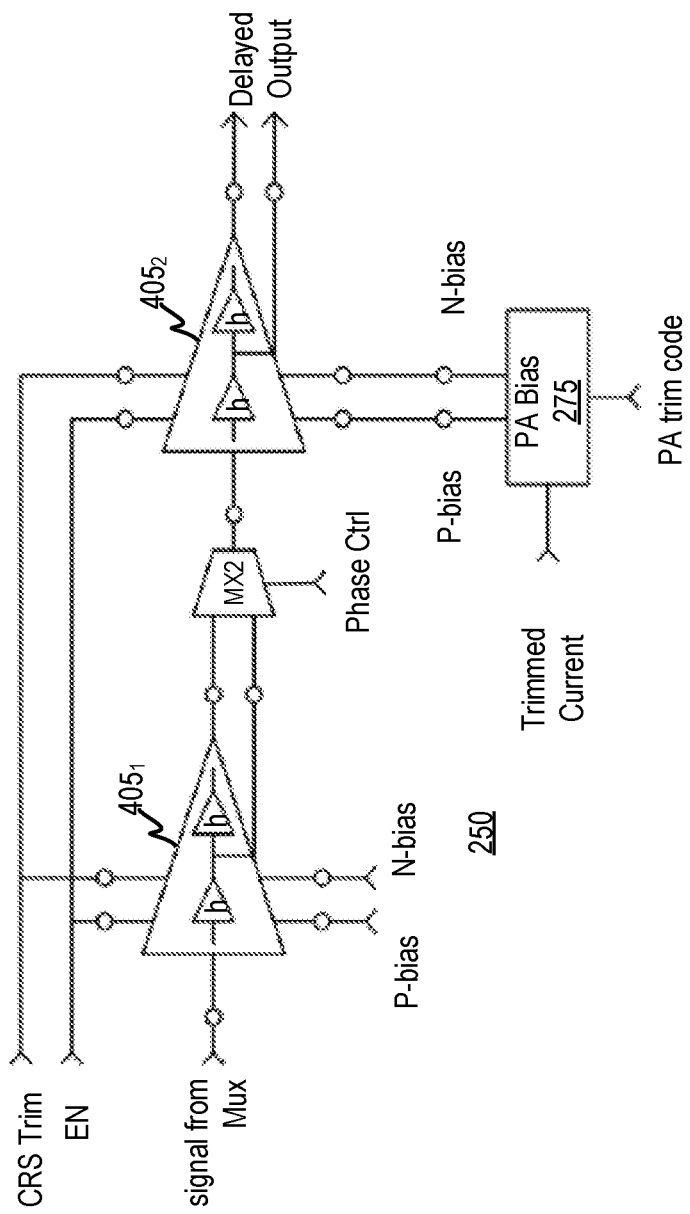
FIG. 7 shows a phase adjustor with an additional delay cell in accordance with some embodiments.

FIG. 7 shows another embodiment for implementing a phase adjustor 250. The input delay cell receives a phase from a slave DLL selected by the multiplexer. This delay cell (two inverters) is trimmed to the required delay by the coarse trimming code and P/N bias voltages from the master DLL and intended to split the input phase into two adjacent phases for the second delay cell. It allows halving of the number of routed phases and thereby simplifying the circuit and layout.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus comprising:
a clock node;
delay cells coupled in series; and
a phase detector coupled to an output of one of the delay cells and to the clock node, wherein at least one of the delay cells comprises:
a current starved inverter including:
a p-type adjustable current source having a plurality of selectable p-type devices, wherein the plurality of selectable p-type devices can be selected digitally by a first digital bus or biased by a first bias; and
an n-type adjustable current source having a plurality of selectable n-type devices, wherein the plurality of selectable n-type devices can be selected digitally by a second digital bus or biased by a second bias.

2. The apparatus of claim 1, wherein the at least one of the delay cells comprises a p-type device coupled in series with the p-type adjustable current source.

3. The apparatus of claim 2, wherein the at least one of the delay cells comprises an n-type device coupled in series with the n-type adjustable current source.

4. The apparatus of claim 1 comprises a bias generator to generate the first and second biases.

5. The apparatus of claim 4, wherein the bias generator includes trim-able strength devices to adjust current strength to change first and second biases.

6. The apparatus of claim 1, wherein the at least one of the delay cells has a differential output.

7. A system comprising:
a processor;
a memory interface to provide a clock signal, the memory interface coupled to the processor; and
a digital phase controlled delay circuit coupled to the memory interface, the digital phase controlled delay circuit comprising:
a clock node;
delay cells coupled in series; and
a phase detector coupled to an output of one of the delay cells and to the clock node, wherein at least one of the delay cells comprises:
a current starved inverter including:
a p-type adjustable current source having a plurality of selectable p-type devices, wherein the plurality of selectable p-type devices can be selected digitally by a first digital bus or biased by a first bias; and an n-type adjustable current source having a plurality of selectable n-type devices, wherein the plurality of selectable n-type devices can be selected digitally by a second digital bus or biased by a second bias.

8. The system of claim 7, wherein the memory interface is a double data rate (DDR) compliant interface.

9. The system of claim 7, wherein the at least one of the delay cells comprises a p-type device coupled in series with the p-type adjustable current source.

10. The system of claim 9, wherein the at least one of the delay cells comprises an n-type device coupled in series with the n-type adjustable current source.

11. The system of claim 7 comprises a bias generator to generate the first and second biases.

12. The system of claim 11, wherein the bias generator includes trim-able strength devices to adjust current strength to change first and second biases.

13. The system of claim 7, wherein the at least one of the delay cells has a differential output.

14. An apparatus comprising:
a phase multiplexer; and
a plurality of delay cells, wherein output of at least two of the delay cells of the plurality are received by the phase multiplexer, wherein at least one of the two delay cells includes:
a clock node;
delay cells coupled in series; and
a phase detector coupled to an output of one of the delay cells and to the clock node, wherein at least one of the delay cells comprises:
a current starved inverter including:
a p-type adjustable current source having a plurality of selectable p-type devices, wherein the plurality of selectable p-type devices can be selected digitally by a first digital bus or biased by a first bias; and
an n-type adjustable current source having a plurality of selectable n-type devices, wherein the plurality of selectable n-type devices can be selected digitally by a second digital bus or biased by a second bias.

15. The apparatus of claim 14, wherein the at least one of the delay cells comprises a p-type device coupled in series with the p-type adjustable current source.

16. The apparatus of claim 15, wherein the at least one of the delay cells comprises an n-type device coupled in series with the n-type adjustable current source.

17. The apparatus of claim 14 comprises a bias generator to generate the first and second biases.

18. The apparatus of claim 17, wherein the bias generator includes trim-able strength devices to adjust current strength to change first and second biases.

19. The apparatus of claim 14, wherein the at least one of the delay cells has a differential output.

20. An apparatus comprising:
a bias current generator;
a current mirror coupled to the bias current generator, wherein an output of the current mirror is to provide a first bias and a second bias;
a delay cell having a programmable delay, wherein the delay cell is to receive the first bias and the second bias, wherein the current mirror is to adjust the first bias and the second bias in response to an output of a phase detector.

21. The apparatus of claim 20, wherein the bias current generator comprises:
a first supply node to provide a first power supply;
a first transistor coupled to the first supply node;
a first resistive device coupled in series with the first transistor;
a second resistive device coupled in series with the first transistor; and
a second transistor coupled in series with the second resistive device and the current mirror.

22. The apparatus of claim 21, wherein bias current generator further comprises:
a first capacitive device coupled to the first and second resistive devices; and
a second capacitive device coupled to the second resistive device and to the second transistor.

23. The apparatus of claim 21, wherein the current mirror comprises:
a second supply node to provide a second power supply, wherein the second power supply has a voltage level which is lower that than a voltage level of the first power supply;
a plurality of transistors which are thermometer weighted, wherein at least one of the transistors of the plurality is coupled to the second transistor of the bias current generator;
a first p-type transistor coupled to a second supply node and to at least one of the transistors of the plurality; and
a second p-type transistor coupled is parallel to the first p-type transistor, wherein the first p-type transistor is to provide with first bias and wherein the second p-type transistor is to provide the second bias.

* * * * *